(12) United States Patent
Miida

(10) Patent No.: US 6,653,164 B2
(45) Date of Patent: Nov. 25, 2003

(54) SOLID STATE IMAGING DEVICE, MANUFACTURING METHOD THEREOF, AND SOLID STATE IMAGING APPARATUS

(75) Inventor: Takashi Miida, Kanagawa (JP)

(73) Assignee: Innotech Corproation (JP)

( * ) Notice: Subject to any disclaimer, the term of this patent is extended or adjusted under 35 U.S.C. 154(b) by 0 days.

(21) Appl. No.: 10/290,363

(22) Filed: Nov. 8, 2002

(65) Prior Publication Data

US 2003/0064539 A1 Apr. 3, 2003

Related U.S. Application Data

(62) Division of application No. 09/722,041, filed on Nov. 27, 2000, now Pat. No. 6,545,331.

(30) Foreign Application Priority Data

Dec. 10, 1999 (JP) .............................. 11-351987
Aug. 4, 2000 (JP) ....................... 2000-237513

(51) Int. Cl.[7] ................................................ H01L 21/00
(52) U.S. Cl. ........................................ 438/57; 438/48
(58) Field of Search ..................................... 438/48, 57

(56) References Cited

U.S. PATENT DOCUMENTS

| 4,901,129 A | 2/1990 | Hynecek | 357/30 |
|---|---|---|---|
| 5,528,043 A | 6/1996 | Spivey et al. | 250/370.09 |
| 6,166,769 A | 12/2000 | Yonemoto et al. | 348/308 |
| 6,225,670 B1 | 5/2001 | Dierickx | 257/431 |

FOREIGN PATENT DOCUMENTS

| JP | 60-140752 | 7/1985 |
|---|---|---|
| JP | 60-206063 | 10/1985 |
| JP | 2-304973 | 12/1990 |
| JP | 5-316283 | 11/1993 |
| JP | 7-326736 | 12/1995 |
| JP | 11-195778 | 7/1999 |

*Primary Examiner*—Richard Elms
*Assistant Examiner*—Beth E. Owens
(74) *Attorney, Agent, or Firm*—Lorusso, Loud & Kelly

(57) ABSTRACT

A sole state imaging device includes a photodetection diode and an insulated gate field effect transistor provided adjacent to the photodetection diode for optical signal detection. In a method of making the device, a carrier pocket is formed in a second well region, and an element isolation insulating film is formed to isolate adjacent unit pixels from each other. In addition, an element isolation region of an opposite conductivity type is formed to isolate a second semiconductor layer of one conductivity type in such a way as to include the lower surface of the element isolation insulating film and reach a first semiconductor layer.

8 Claims, 15 Drawing Sheets

SOLID STATE IMAGING DEVICE, MANUFACTURING METHOD THEREOF, AND SOLID STATE IMAGING APPARATUS

CROSS-REFERENCE TO RELATED APPLICATIONS

This application is a division of U.S. Ser. No. 09/722,041, filed Nov. 27, 2000 which issued as U.S. Pat. No. 6,545,331 on Apr. 8, 2003 and claims, under 35 USC 119, priority of Japanese Application No. 11-351987 filed Dec. 10, 1999 and Japanese Application 2000-237513 filed Aug. 4, 2000.

BACKGROUND OF THE INVENTION

1. Field of the Present Invention

The present invention relates to a solid state imaging device, its manufacturing method and a solid state imaging apparatus. More particularly, the present invention relates to a solid state imaging device which uses a MOS image sensor based on a threshold voltage modulation system used for a video camera, an electronic camera, an image input camera, a scanner, a facsimile or the like, its manufacturing method and a solid state imaging apparatus.

2. Description of the Prior Art

Because of its high mass productivity, a semiconductor image sensor such as a CCD image sensor, a MOS image sensor or the like has been applied to almost all types of image input devices following the progress in a pattern microfabrication technology.

Particularly, in recent years, the applicability of the MOS image sensor has been recognized again because of its advantages, i.e., lower power consumption compared with that of the CCD image sensor, and the capability of making a sensor device and a peripheral circuit device by the same CMOS technology.

FIG. 1 is a sectional view showing such a MOS image sensor.

In the drawing, a photodetection diode 311 and a MOS transistor 312 for optical signal detection constitute one unit pixel. To isolate adjacent unit pixels from each other, an element isolation insulating film 214 is formed on a semiconductor layer 212 in an element isolation region. In addition, a light shielding film 223 is formed on a coating insulating film 226 in such way as to cover the MOS transistor for optical signal detection. The light shielding film 223 includes a light receiving window 224 formed on the light receiving portion of the photodetection diode 311 to transmit an optical signal.

In both of the forming regions of the photodetection diode 311 and the MOS transistor 312 for optical signal detection, well regions 215a and 215b are formed on the surface of the-semiconductor layer 212.

Source and drain regions 216 and 217a are formed in the well region 215b of the MOS transistor 312. On the other hand, on the surface of the well region 215a of the photodetection diode 311, a region 217 of one conductivity type is formed to be connected to the drain region 217a of one conductivity type and, thus, a buried structure is formed for optically generated charges.

A source electrode 220 is connected to the source region 216, and a drain electrode 222 is connected to the region 217 of one conductivity type, i.e., the drain region 217a. Further, a gate electrode 219 is formed above a channel region 215c between the source and drain regions 216 and 217a by interpolating a gate insulating film 218.

In the vicinity of the source region 216, a hole pocket (carrier pocket) 225 is formed in the well region 215b. In this pocket, light generation holes are stored, and a threshold of the MOS transistor 312 is changed in proportion to the storage amount of such light generation holes.

A series of operations of the MOS image sensor are passed through an initializing period, a storing period and a reading period. During the initializing period, a high reverse voltage is applied to each electrode for depletion, and light generation holes remaining in the hole pocket 225 are discharged. During the storing period, light generation holes are formed by light irradiation and then stored in the hole pocket 225. Then, during the reading period, an optical signal proportional to the storage amount of light generation holes is detected.

By the way, In the MOS image sensor, defects tend to occur in an interface between the element isolation insulating film 214 and the semiconductor layer 212 and, in most cases, holes are captured in the defects. These holes are discharged during the initializing or storing period. The holes are injected through the depleted n type semiconductor layer 212 into the p type well regions 215a and 215b, and then stored in the hole pocket 225. The holes discharged from the defects and stored in the hole pocket 225 result in the generation of fixed pattern noise.

SUMMARY OF THE INVENTION

The object of the present present invention is to provide a solid state imaging device, which employs a MOS image sensor capable of suppressing fixed pattern noise generated by charges discharged from defects in an interface or the like between an element isolation insulating film and a semiconductor layer, and performing much more microfabrication. The object of the present invention is also to provide a manufacturing method of the solid state imaging device and a solid state imaging apparatus equipped with the solid state imaging device.

The present invention is directed to a solid state imaging device. As shown in FIG. 3A, the present invention includes a unit pixel 101 which, in turn, includes a photodetection diode 111 and an insulated gate field effect transistor (MOS transistor) 112 adjacent to the photodetection diode 111 for optical signal detection, wherein an element isolation insulating film 14 is formed so as to isolate adjacent unit pixels 101 from each other, and an element isolation region 13 of an opposite conductivity type to that of a second semiconductor layer 12, the element isolation region 13 isolating the second semiconductor layer 12, is formed under a lower surface of the element isolation insulating film 14, so as to reach first semiconductor layer 11.

Either an impurity region 17 or a drain region 17b is formed so as to be extended near the element isolation region 13, and a drain electrode 22 is formed near the element isolation region 13 so as to be connected to either the impurity region 17 or the drain region 17b.

The photodetection diode 111 and the insulated gate field effect transistor (MOS transistor) 112 for optical signal detection are formed in well regions 15a and 15b connected to each other, and comprise a buried layer having a high concentration (carrier pocket) 25 for storing optically generated charges in the well region 15b in the peripheral portion of a source region of the MOS transistor 112 for optical signal detection.

Generally, there are many levels in an interface between the insulating film and the semiconductor layer. Especially, in the case that the element isolation insulating film 14 is formed by local oxidation of silicon (LOCOS), defects caused by thermal distortion tend to occur in addition to an interface state. In the case that the drain regions 17a and 17b are adjacent to the element isolation insulating film 14, in the end portions of the drain regions 17a and 17b, a pn junction tail end of the drain regions 17a and 17b is in contact with the surface, and a surface state is included in a depletion layer extending transversely from the drain regions 17a and 17b. Consequently, current leakage is apt to occur. As described above, according to the present invention, the element isolation region 13 of a conductivity type opposite that of the second semiconductor layer 12, which isolates the second semiconductor layer 12 to reach the first semiconductor layer 11, is formed under the entire lower surface of the element isolation insulating film 14. Thus, in initializing and storing periods, when a positive voltage is applied to the n type drain regions 17a and 17b, a depletion layer extending from the p type well regions 15a and 15b or the p type substrate 11 reaches only the outer peripheral portion of the element isolation region 13 without extending to therein and, hence, the defects in the interface are not covered with the depletion layer. Therefore, charges captured in the defects of the interface can be prevented from being discharged into the depletion layer, and it is possible to suppress fixed pattern noise generated by the storage of charges in the hole pocket (carrier pocket) 25 caused by such defects in the interface.

A drain electrode 22 is provided in the end portion of the drain region 17b and near the element isolation region 13. In initializing and storing periods, the drain electrode 22 is set at the highest potential, while the substrate 11 and the element isolation region 13 connected to the substrate 11 are set at the lowest potential. In other words, since the drain electrode 22 and the element isolation region 13 are close to each other, as shown in FIG. 6B, a steep potential inclination is created from the drain electrode 22 to the element isolation region 13. Even if current leakage occurs in the end portions of the drain regions 17a and 17b due to this potential inclination, charges causing current leakage immediately flow toward the substrate 11, and the leakage current scarcely flows to the well regions 15a and 15b, that is, to the hole pocket 25.

Accordingly, it is possible to further suppress fixed pattern noise generated by the storage of charges in the hole pocket 25 owing to the defects.

In the case that the well region or the like has a conductivity type opposite the foregoing, in other words, in the case that the buried layer having a high concentration is an n type, the buried layer having a high concentration becomes an electron pocket (carrier pocket) to store light generation electrons. In the initializing and storing periods, the drain electrode is set at the lowest potential, while the substrate and the element isolation region connected to the substrate are set at the highest potential. Thus, even if current leakage occurs in the end portion of the drain region, charges causing current leakage immediately flow toward the substrate 11, and the leakage current scarcely flows to the electron pocket.

Since the element isolation insulating film is formed on the element isolation region such that the entire lower surface thereof can be included in the element isolation region, charges captured in the defects of the interface can be prevented from being discharged in the depletion layer thereof. It is therefore possible to suppress fixed pattern noise generated by the storage of charges in the electron pocket owing to such defects in the interface.

The present invention is directed also to the solid state imaging device, the method of manufacturing the same and the solid imaging apparatus. Another fundamental constitution of the solid state imaging device is as follows. As shown in FIG. 11, a plurality of unit pixels 101 are arrayed, each thereof including a photodetection diode 111 and an insulated gate field effect transistor (MOS transistor) 112 adjacently to the photodetection diode 111 for optical signal detection, and adjacent unit pixels are isolated from each other by an element isolation electrode 19a.

Further, as shown in FIG. 12A, the solid state imaging device comprises a carrier pocket 25 near and along a source region 16 in a well region 15b below a gate electrode 19 of the MOS transistor 112. The carrier pocket 25 has a higher concentration of p type impurities than that of the well regions 15a and 15b and stores optically generated charges generated in the photodetection diode 111.

A manufacturing method of the solid state imaging device according to the present invention comprises the steps of: as shown in FIG. 13D, forming a gate insulating film 18, and an insulating film 18a similar to the gate insulating film 18 in an element isolation region 113 for isolating adjacent unit pixels 101 from each other; patterning a conductive film to form a gate electrode 19 on the gate insulating film 18, and an element isolation electrode 19a on the insulating film 18a; and as shown in FIG. 13E, by using the gate electrode 19 and the element isolation electrode 19a as masks; forming regions of an opposite conductivity type such as source regions 16a and 16b, drains regions 17a and 17b or the like and isolating elements, by introducing impurities of an opposite conductivity type In other words, adjacent regions of an opposite conductivity type between the unit pixels below the element isolation electrode 19a are isolated from each other.

If the gate electrode has a ring shape, drain regions 17a and 17b and impurity regions of the adjacent unit pixels 101 are isolated from each other below the element isolation electrode 19a.

On the other hand, if the gate electrode 19 has a square shape, among the source, drain and impurity regions of the adjacent unit pixels, the regions adjacent to each other are isolated below the element isolation electrode 19a. In other words, the source regions of the adjacent unit pixels are isolated from each other, alternatively the source, drain and impurity regions are isolated from one another, otherwise the drain and impurity regions are isolated from each other below the element isolation electrode 19a.

According to the present invention, as described above, element isolation regions are made of impurity regions of opposite conductivity type. Thus, the occurrence of defects caused by thermal distortion can be suppressed, and current leakage caused by the interface state can be greatly reduced. It is therefore possible to suppress fixed pattern noise generated by the storage of charges other than optically generated charges in the hole pocket (carrier pocket) 25.

In addition, a diffusion separation region 13 is formed below the element isolation electrode 19a. The diffusion layer 13 isolates an n type well layer (a layer of an opposite conductivity type) 12 and reaches the substrate 11. In the case that the diffusion separation region 13 is a p type, since a potential like that shown in FIG. 14 is formed for holes near the diffusion separation region 13 by setting the diffusion separation region 13 at a ground potential or a negative potential while the substrate 11 is set at a ground or negative potential, holes from such defects can be discharged through the diffusion separation region 13 to the substrate 11. Thus, the holes can be prevented from flowing to the carrier pocket 25, even if defects or the like occur in a boundary between the drain regions 17a and 17b near the element isolation region 13 or between the impurity region 17 and the insulating film 18a. It is therefore possible to further suppress fixed pattern noise generated by the storage of charges in the carrier pocket 25 owing to the defects.

According to the present invention, much more microfabrication can be achieved by forming element isolation regions made of impurity regions of opposite conductivity type.

By incorporating the solid state imaging device having the foregoing features in a solid state imaging apparatus, such as a video camera, an electronic camera, an image input camera, a scanner, a facsimile or the like, it is possible to miniaturize the apparatus and improve image quality.

DESCRIPTION OF THE PREFERRED EMBODIMENTS (First Embodiment)

Now, a first embodiment of the present invention will be described with reference to the accompanying drawings.

Figure 1:
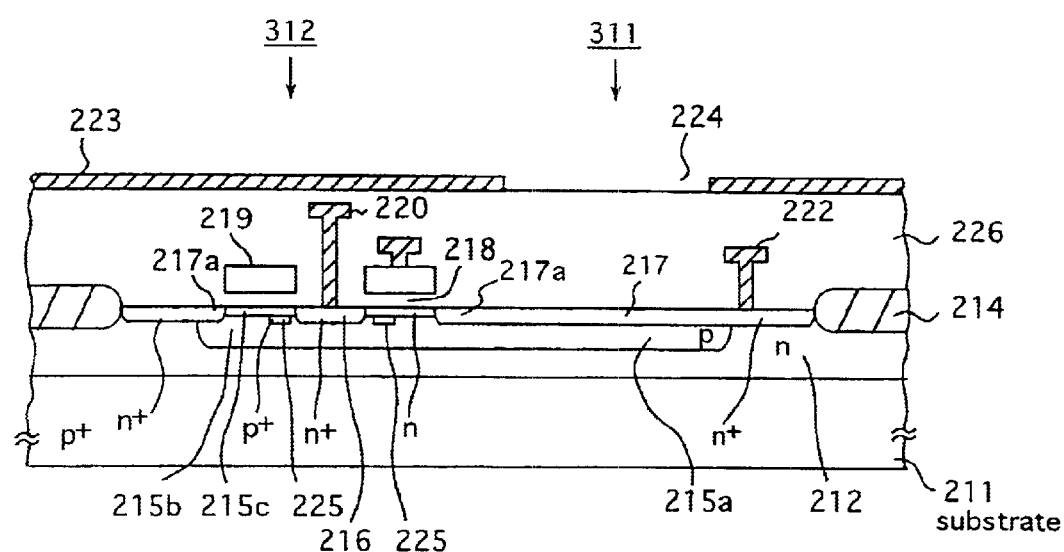
FIG. 1 is a sectional view showing a device structure in a unit pixel of a conventional solid state imaging device.
Figure 2:
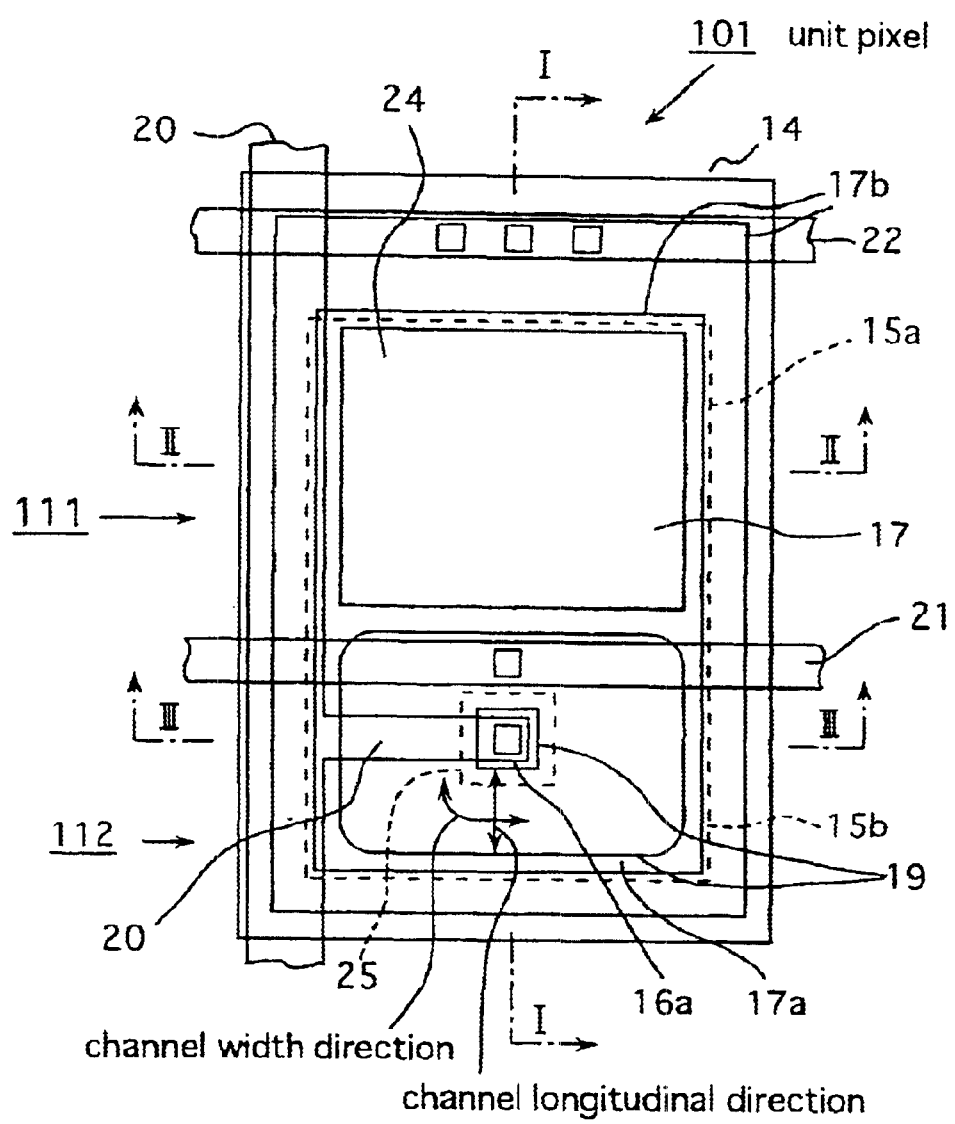
FIG. 2 is a plan view showing an element layout in a unit pixel of a solid state imaging device according to a first embodiment of the present invention.

FIG. 2 is a plan view showing an element layout in a unit pixel of a MOS image sensor according to the first embodiment of the present invention.

As shown in FIG. 2, in a unit pixel 101, a photodetection diode 111 and a MOS transistor 112 for optical signal detection are provided adjacent to each other. For the MOS transistor 112, an n channel MOS (n MOS) having a lightly doped drain structure (LDD structure) is employed.

The photodetection diode 111 and the MOS transistor 112 are formed in different well regions, i.e., first and second well regions 15a and 15b, which are connected to each other. The first well region 15a in the photodetection diode 111 constitutes a part of the region which generates charges by light irradiation. The second well region 15b in the MOS transistor 112 constitutes a gate region capable of changing a channel threshold voltage by a potential applied to the region 15b.

The MOS transistor 112 comprises a lightly doped drain (LDD) structure. Drain regions 17a and 17b are formed so as to surround the outer peripheral part of a ring-shaped gate electrode 19, while source regions 16a and 16b are formed so as to be surrounded with the inner periphery of the ring-shaped gate electrode 19.

The drain region 17a having a low concentration is extended to form an impurity region 17 of the photodetection diode 111, which is substantially equal in impurity concentration to the drain region 17a. In other words, the impurity region 17 and the low concentration drain region 17a are formed to be united with each other such that most parts thereof can be placed in contact with the surface layers of the first and second well regions 15a and 15b. In the outer peripheral portion of the impurity region 17 and the low concentration drain region 17a, the drain region having a high concentration 17b is formed as a contact layer so as to be connected to the low concentration drain region 17a by being kept away from a photodetection portion.

In addition, a carrier pocket (buried layer having a high concentration) 25 as a characteristic of the MOS image sensor is formed in the peripheral portion of the source region 16a within the second well region 15b below the gate electrode 19 in such a way as to surround the source regions 16a and 16b.

The drain regions 17a and 17b are connected through the contact layer 17b of low resistance to a drain voltage (VDD) supply line (or a drain electrode) 22; the gate electrode 19 to a vertical scanning signal (VSCAN) supply line 21; and the source regions 16a and 16b through the contact layer 16b of low resistance to a vertical output line (or a source electrode) 20.

The components of the unit pixel are covered with an insulating film 26, and the regions other than the light receiving window 24 of the photodetection diode 111 are shielded from lights by a metal layer (light shielding film) 23 on the insulating film 26.

In the device operation of the MOS image sensor for optical signal detection, a series of periods including sweeping (initializing), storing, and reading are repeated, for example in the order of sweeping (initializing)-storing-reading-sweeping (initializing)- . . . .

In the sweeping period (initializing), prior to storage of optically generated charges (light generation carriers), optically generated charges, acceptors, donors or the like remaining after reading are neutralized, alternatively residual charges such as holes, electrons or the like captured in a surface state before optical signal reading are discharged out of a semiconductor, and the carrier pocket 25 is thereby vacated. Positive high voltages of about +5 V or higher, usually 7 to 8 V, are applied to the source regions 16a and 16b, the drain regions 17a and 17b and the gate electrode 19.

In the storing period, carriers are generated by light irradiation, and holes among the carriers are moved in the first and second well regions 15a and 15b and then stored in the carrier pocket 25. Positive voltages of about +2 to 3 V are applied to the drain regions 17a and 17b, and a low positive or negative voltage is applied to the gate electrode 19 to enable the MOS transistor 112 to maintain a cut-off state.

In the reading period, a change in the threshold voltage of the MOS transistor 112 caused by the optically generated charges stored in the carrier pocket 25 is read as a change of a source potential. To operate the MOS transistor 112 in a saturated state, positive voltages of about +2 to 3 V are applied to the drain regions 17a and 17b, and a positive voltage of about +2 to 3 V is applied to the gate electrode 19.

Next, description will be made of a device structure of the MOS image sensor of the embodiment of the present invention with reference to the sectional views.

Figure 3A:
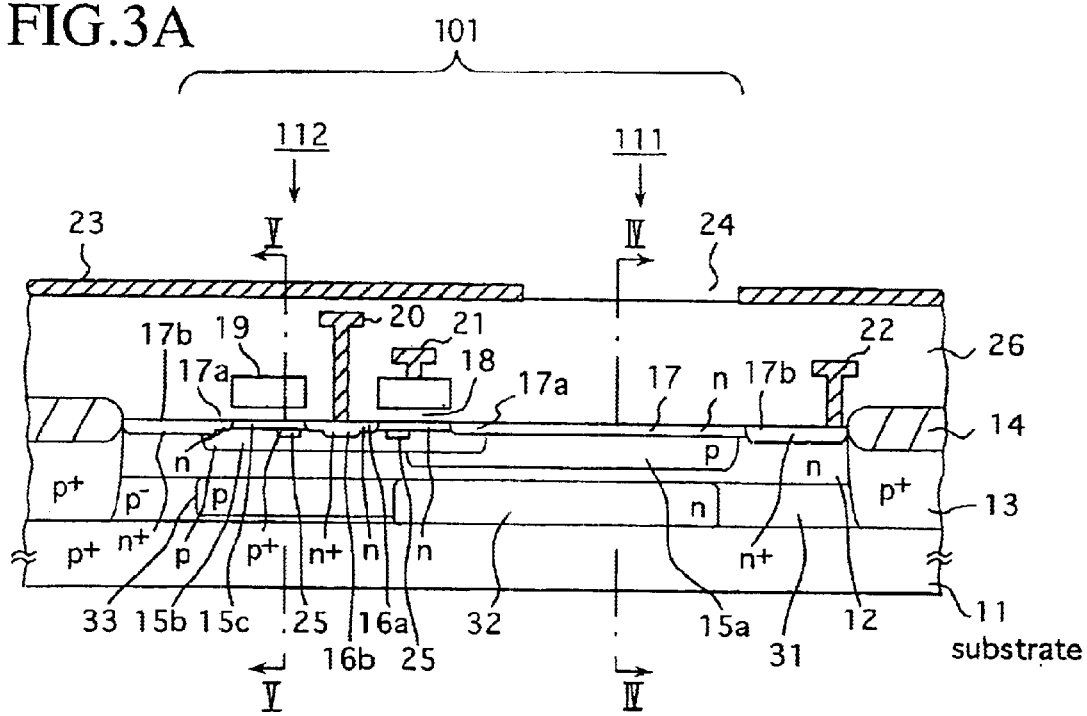
FIG. 3A is a sectional view taken on line I—I of FIG. 2, showing a device structure in a unit pixel in the solid state imaging device of the first embodiment of the present invention.

FIG. 3A is a sectional view taken on line I—I of FIG. 2, specifically showing the device structure of the MOS image sensor of the first embodiment of the present invention.

Figure 3B:
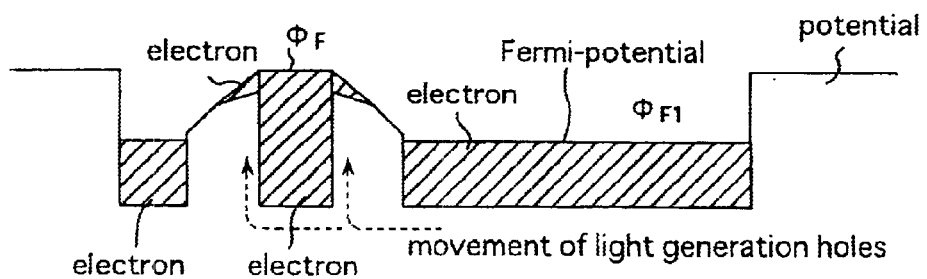
FIG. 3B is a view showing a state of a potential, where light generation holes are stored in a carrier pocket, and electrons are induced in a channel region to form an inversion region.

FIG. 3B is a view showing a state of a potential along the surface of a semiconductor substrate.

Figure 4:
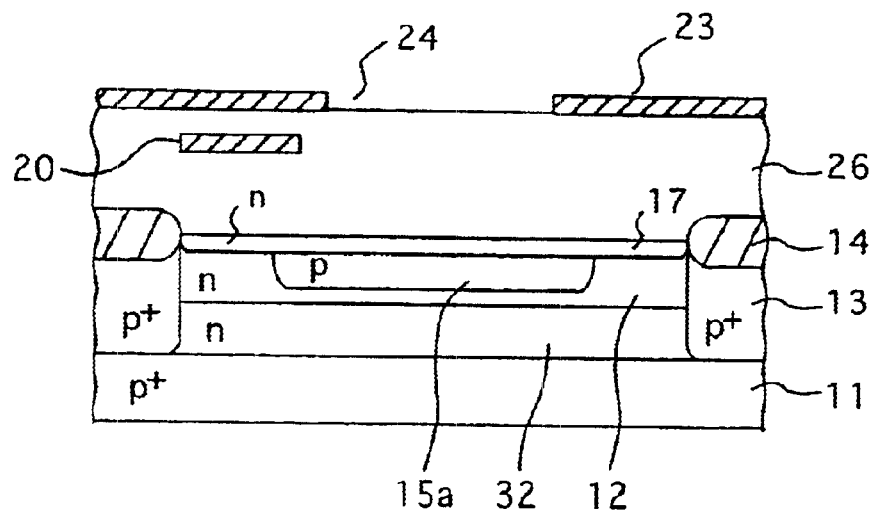
FIG. 4 is a sectional view taken on line II—II of FIG. 2, showing a structure of a photodetection diode in the unit pixel of the solid state imaging device of the first embodiment of the present invention.
Figure 5:
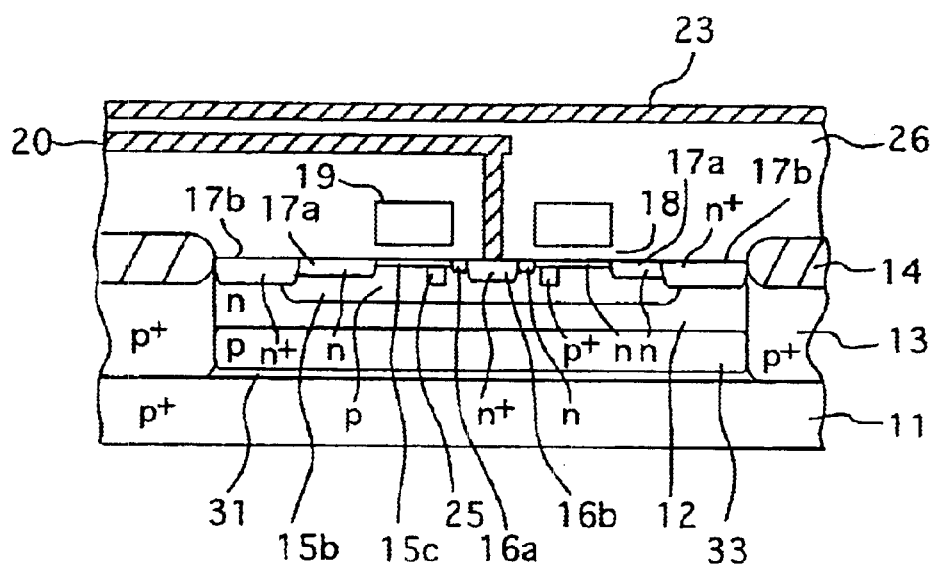
FIG. 5 is a sectional view taken on line III—III of FIG. 2, showing a structure of a MOS transistor for optical signal detection in the unit pixel of the solid state imaging device of the first embodiment of the present invetion.

FIG. 4 is a sectional view taken on line II—II of FIG. 2; and FIG. 5 a sectional view taken on line III—III of FIG. 2.

Figure 6A:
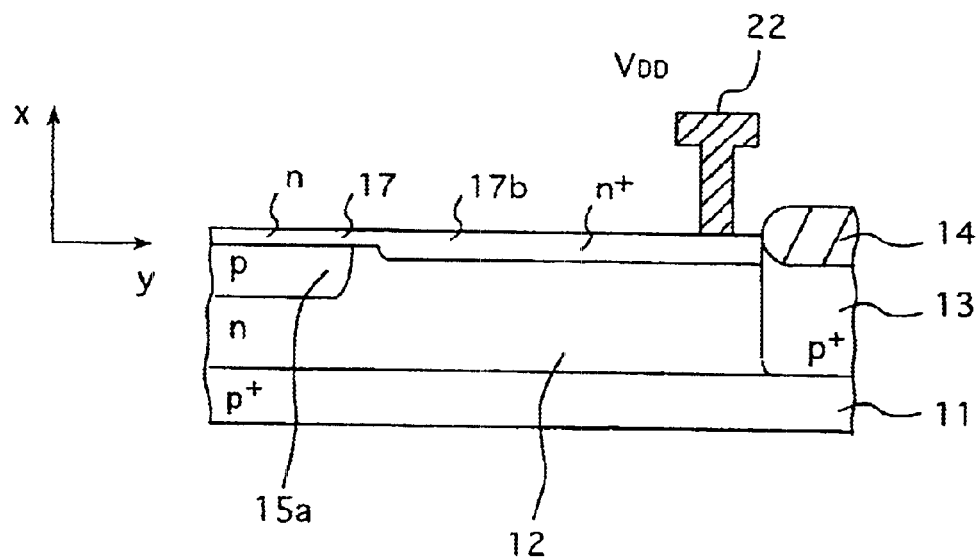
FIG. 6A is a sectional view showing a connected state of a drain electrode provided in the solid state imaging device of the first embodiment of the present invention.
Figure 6B:
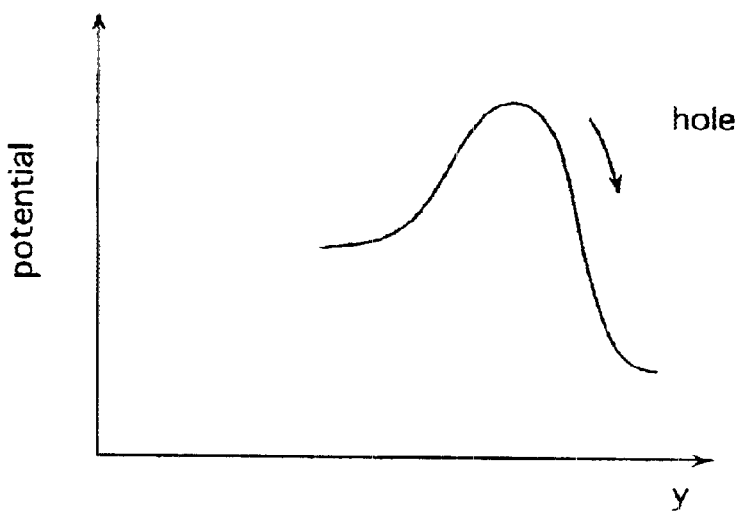
FIG. 6B is a graph showing a potential distribution in the vicinity of the drain electrode.

FIG. 6A is a detailed sectional view in the vicinity of an element isolation region 13; and FIG. 6B a graph showing a potential distribution in the vicinity of the element isolation region 13 when a positive voltage is applied to a drain electrode.

As shown in FIG. 3A, p type silicon having impurity concentration set at about $1 \times 10^{15}$ cm$^{-3}$ is epitaxially grown on a substrate 11 made of p type silicon having impurity concentration set at $1 \times 10^{18}$ cm$^{-3}$ or higher, and thereby an epitaxial layer (third semiconductor layer) 31 is formed.

In this epitaxial layer 31, a plurality of unit pixels 101, each thereof including the photodetection diode 111 and the MOS transistor 112 for optical signal detection, are formed. Then, to isolate the unit pixels 101 from each other, a field insulating film (element isolation insulating film) 14 is formed by local oxidation of silicon (LOCOS) on the surface of the epitaxial layer 31 between the adjacent unit pixels 101. Further, as shown in FIG. 6A, under the field insulating film 14 and on the substrate 11, a p type element isolation region 13 is formed so as to include an entire interface between the epitaxial layer 31 and the field insulating film 14 and to isolate an n type well layer (a region of one conductivity type) 12.

Next, the photodetection diode 111 will be described in detail by referring to FIGS. 3A and 4.

The photodetection diode 111 is constituted of: an n type buried layer (a buried layer of one conductivity type) buried in the epitaxial layer 31 to be in contact with the substrate 11; a low concentration n type well layer (a region of one conductivity type) 12 formed on the n type buried layer 32; a p type first well region 15a formed on the surface layer of the n type well layer 12; and an n type impurity region 17 extending from the surface layer of the first well region 15a to the surface layer of the n type well layer 12. The p type substrate 11 constitutes a first semiconductor layer of an opposite conductivity type of the photodetection diode 111 portion. Likewise, the n type buried layer 32 and the low concentration n type well layer 12 formed thereon constitute a second semiconductor layer of one conductivity type.

The impurity region 17 is formed so as to be extended from the low concentration drain region 17a of the MOS transistor 112 for optical signal detection comprising a lightly doped drain (LDD) structure. The impurity region 17 has an impurity concentration which is substantially equal to that of the low concentration drain region 17a. Since the impurity region 17 has a low impurity concentration, the shallower impurity region 17 is formed. Thus, a blue light having a short wavelength and which is suddenly attenuated as the light leaves away from the surface can be received with a sufficient intensity.

In the above-described storing period, the impurity region 17 is connected to the drain voltage supply line 22, and biased at a positive potential. At this time, a depletion layer is spread from a boundary surface between the impurity region 17 and the first well region 15a to the entire first well region 15a, and then reaches the n type well layer 12. On the other hand, a depletion layer is spread from a boundary surface between the substrate 11 and the n type buried layer 32 to the entire n type buried layer 32 and the n type well layer 12 thereon, and then reaches the first well region 15a.

In the first well region 15a and the n type layers 12 and 32, a potential distribution is made in a manner that a potential is gradually reduced from the substrate 11 side to the surface side. Accordingly, holes generated by lights in the first well region 15a and the n type layers 12 and 32 remain in the first well region 15a or the n type layers 12 and 32 without flowing out to the substrate 11 side. Since the region 15a and the n type layers 12 and 32 are connected to the gate region 15b of the MOS transistor 112, the holes generated by lights can be effectively utilized as charges for threshold voltage modulation of the MOS transistor 112. In other words, all the first well region 15a and the n type layers 12 and 32 become carrier generation regions by lights.

Therefore, because of the presence of the n type buried layer 32, a total thickness of the carrier generation region of the photodetection diode 111 becomes thicker. Thus, when the photodetection diode 111 is irradiated with a light, the carrier generation region thereof becomes a photodetector which is highly sensitive to a light of a long wavelength, such as a red light, which reaches the deep portion of the photodetector.

The above-described photodetection diode 111 includes the carrier generation region by lights disposed under the impurity region 17. In this regard, the photodetection diode 111 has a buried structure for holes generated by lights. Thus, it is possible to reduce noise without being affected by the semiconductor layer surface of many capturing states.

Next, the MOS transistor 112 for optical signal detection will be described in detail by referring to FIGS. 3A and 5.

The MOS transistor 112 portion comprises the following elements sequentially from the bottom: a p type substrate 11; a p type epitaxial layer 31 formed on the substrate 11; a p type buried layer (buried layer of an opposite conductivity type) 33 formed in the epitaxial layer 31; an n type well layer 12 formed directly on the p type buried layer 33; and a second p type well region 15b formed in the n type well layer 12. The p type substrate 11 and the epitaxial layer 31 including the p type buried layer 33 constitute a first semiconductor layer of an opposite conductivity type of the MOS transistor 112 portion. Likewise, the n type well layer 12 constitutes a second semiconductor layer of one conductivity type, and the epitaxial layer 31 including the p type buried layer 33 constitutes a third semiconductor layer.

The MOS transistor 112 comprises a structure in such a way as to surround the outer periphery of the ring-shaped gate electrode 19 with the n type low concentration drain region 17a. The n type low concentration drain region 17a is integrally formed with the n type impurity region 17. In the outer peripheral portion of the impurity region 17 extended from the low concentration drain region 17a, a drain region having a high concentration 17b is formed so as to be connected to the impurity region 17, and extended to the element isolation region 13 and the element isolation insulating film 14. The drain region having a high concentration 17b becomes a contact layer for the drain electrode 22. As shown in FIG. 6A, the drain electrode 22 is connected to the drain region having a high concentration 17 near the element isolation region 13 and the element isolation insulating film 14.

In addition, n type source regions 16a and 16b are formed to be surrounded with the ring-shaped gate electrode 19. For the source regions 16a and 16b, a center portion is highly concentrated, and a peripheral portion is lightly concentrated. A source electrode 20 is connected to the source region having a high concentration 16b as a contact layer.

The gate electrode 19 is formed above the second well region 15b between the drain region 17a and the source region 16b by interpolating a gate insulating film 18. The surface layer of the second well region 15b below the gate electrode 19 becomes a channel region. Further, to maintain the channel region in an inversion or depletion state at a usual operation voltage, n type impurities of proper concentration are introduced to the channel region to form a channel doped layer 15c.

A p+ type carrier pocket (buried layer having a high concentration) 25 is formed in a part of the region of a channel longitudinal direction in the second well region 15b under the channel region, i.e., in the peripheral portion of the source regions 16a and 16b so as to surround these regions. This p+ type carrier pocket 25 can be formed by means of, for example, ion implantation. The carrier pocket 25 is formed in the second well region 15b under the channel region formed on the surface. Preferably, the carrier pocket 25 should be formed not to have the common portion the channel region.

In the p+ type carrier pocket 25, a potential is low for light generation holes among optically generated charges. Accordingly, the light generation holes can be collected in the carrier pocket 25 when voltages higher than a gate voltage are applied to the drain regions 17a and 17b.

FIG. 3B shows a state of a potential where light generation holes are stored in the carrier pocket 25, and electrons are induced in the channel region to form an inversion region. Such stored charges cause a change in the threshold voltage of the MOS transistor 112. Thus, optical signal detection can be carried out by detecting this change of the threshold voltage.

In the above-described carrier sweeping period, a high voltage is applied to the gate electrode 19 and, by using an electric field thereby generated, carriers remaining in the second well region 15b are swept out to the substrate 11 side. In this case, the applied voltage causes a depletion layer to spread from a boundary surface between the channel doped layer 15c of the channel region and the second well region 15b to the second well region 15b, and a depletion layer to spread from a boundary surface between the p type buried layer 33 and the n type well layer 12 to the n type well layer 12 under the second well region 15b.

Thus, the application range of an electric field generated by the voltage applied to the gate electrode 19 mainly includes the second well region 15b and the n type well layer 12 under the same.

In this case, a thickness of the n type well layer 12 under the second well region 15b is thin, and the p type buried layer 33 having a high concentration is formed adjacent to the substrate 11 side of the n type well layer 12. The presence of the p type buried layer 33 having a high concentration limits the spread of the depletion layer to itself. Accordingly, since the depletion layer spreads from the boundary surface between the p type buried layer 33 and the n type well layer 12 mainly into the n type well layer 12 during the sweeping period, a thickness of the entire deletion layer becomes thin.

A voltage from the gate electrode 19 is therefore applied mainly to the second well region 15b. In other words, a sudden potential change occurs in the second well region 15b, and an electric field strong enough to sweep holes to the substrate 11 side is mainly applied to the second well region 15b. Accordingly, carriers stored in the carrier pocket 25 and the second well region 15b can be surely swept out from these areas by a low resetting voltage, and it is therefore possible to increase resetting efficiency.

In the MOS image sensor of the above-described embodiment, the p type element isolation region 13 is formed on the p type substrate 11 located below the element isolation insulating film 14 to include the lower surface of the element isolation insulating film 14 and to isolate the n type well region 12. In other words, defects created in the interface between the element isolation insulating film 14 and the element isolation region 13 is surrounded with the element isolation region 13.

Thus, in the initial and storing periods, when positive voltages are applied to the n type drain regions 17a and 17b, a depletion layer spread from the p type well regions 15a and 15b or the p type substrate 11 only reaches the outer peripheral portion of the element isolation region 13 without spreading in the element isolation region 13. Hence, the defects created in the interface are not surrounded with the depletion layer. Charges captured in the defect can therefore be prevented from being discharged into the depletion layer, making it possible to suppress fixed pattern noise generated by the charges stored in the hole pocket 25 due to the defects.

In addition, as shown in FIG. 6A, the drain electrode 22 is provided near the element isolation insulating film 14 and the element isolation region 13. In this case, in the initial and storing periods, when positive voltages are applied to the n type drain regions 17a and 17b, a depletion layer is spread from the p type well regions 15a and 15b or the p type substrate 11 into the n type well layer 12, resulting in a potential distribution like that shown in FIG. 6B. Specifically, the drain electrode 22 is set at a highest potential while the substrate 11 and the element isolation region 13 connected to the substrate 11 are set at a lowest potential, and a steep potential inclination is accordingly formed from the drain electrode 22 to the element isolation region 13. As a result, even if defects occur because of thermal distortion or the like caused by selective oxidation in the vicinity of the element isolation insulating film 14, and charges captured in the defects are discharged, the charges immediately flows to the substrate 11, making it difficult for the charges to flow toward the well regions 15a and 15b, and therefore to the hole pocket 13.

Accordingly, it is possible to further suppress fixed pattern noise generated by the storage of charges in the hole pocket 25 caused by the defects created in the interface between the element isolation region 13 and the element isolation insulating film 14 or the defects caused by thermal distortion or the like in the vicinity of the element isolation insulating film 14.

Figure 8:
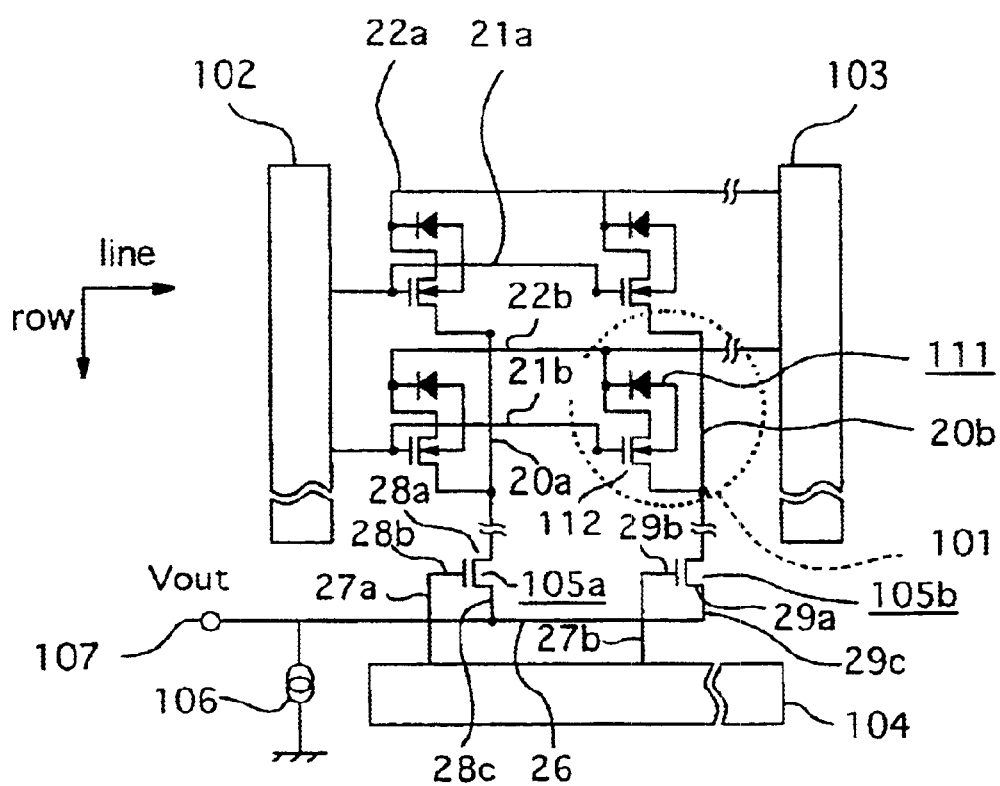
FIG. 8 is a view showing an entire circuitry of the solid state imaging device of the first embodiment of the present invention.

Next, description will be made of an entire constitution of the MOS image sensor employing the unit pixel structured in the foregoing manner by referring to FIG. 8. FIG. 8 shows a circuitry of the MOS image sensor of the described embodiment of the present invention.

As shown in FIG. 8, this MOS image sensor employs the constitution of a two dimensional array sensor, and the unit pixels of the foregoing structure are arrayed in row and column directions in a matrix shape.

A driving scanning circuit 102 for a vertical scanning signal (VSCAN) and a driving scanning circuit 103 for a drain voltage (VDD) are arranged left and right sandwiching a pixel region.

Vertical scanning signal supply lines 21a and 21b are drawn out, one for each row, from the driving scanning circuit 102 of the vertical scanning signal (VSCAN). The vertical scanning signal supply lines 21a and 21b are connected to the gate of the MOS transistor 112 in each of all the unit pixels 101 arrayed in a row direction.

Drain voltage supply lines (VDD supply lines) 22a and 22b are drawn out, one for each row, from the driving scanning circuit 103 of the drain voltage (VDD). The drain voltage supply lines (VDD supply lines) 22a and 22b are connected to the drain region 17a of the MOS transistor 112 for optical signal detection in each of all the unit pixels 101 arrayed in the row direction.

Vertical output lines 20a and 20b are also provided, different for each column. These vertical output lines 20a and 20b are connected to the source region 16a of the MOS transistor 112 in each of all the unit pixels 101 arrayed in a column direction.

In addition, MOS transistors 105a and 105b are provided as switches, different for each column. The vertical output lines 20a and 20b are connected, one each, to the drains (photodetecting signal input terminals) 28a and 29a of the MOS transistors 105a and 105b. The gates (horizontal scanning signal input terminals) 28b and 29b of the switches 105a and 105b are connected to a driving scanning circuit 104 for a horizontal scanning signal (HSCAN).

The sources (photodetecting signal output terminals) 28c and 29c of the switches 105a and 105b are connected through a common constant current source (load circuit) 106 to a video signal output terminal 107. In other words, the source of the MOS transistor 112 in each unit pixel 101 is connected to the constant current source 106 to form a source follower circuit for a pixel unit. Thus, a potential difference between the gate and the source of each MOS transistor 112, and a potential difference between a bulk and the source, are determined by the constant current source 106, to which the connection has been made.

Based on the vertical and horizontal scanning signals (VSCAN) and (HSCAN), the MOS transistors 112 of the respective unit pixels are sequentially driven to read a video signal (Vout) proportional to a light incident quantity.

Figure 9:
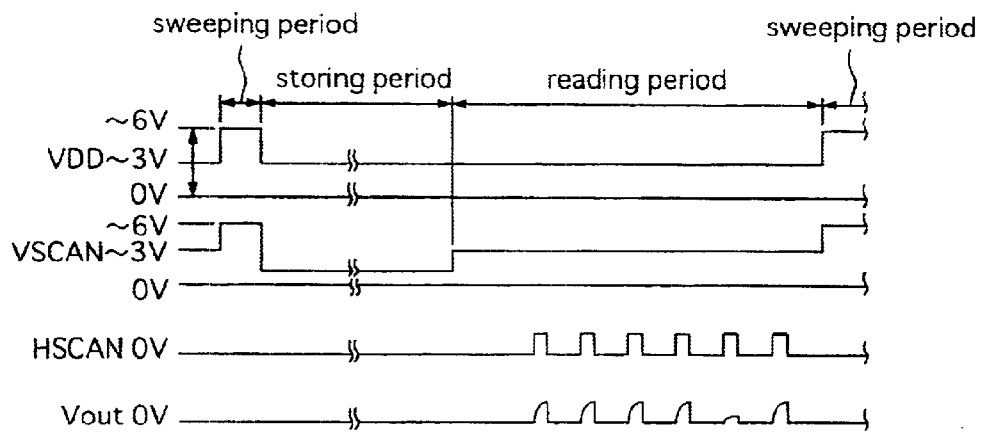
FIG. 9 is a timing chart when the solid state imaging device of FIG. 8 is operated.

FIG. 9 is a timing chart showing each I/O signal used to operate the MOS image sensor of the present invention. The timing chart is applied to the case where the p type first and second well regions 15a and 15b are used, and the MOS transistor 112 for optical signal detection is NMOS.

Now, a series of successive photodetecting operations of the solid state imaging device will be described briefly by referring to FIGS. 8 and 9. The photodetecting operation is carried out by repeating, as described above, a series of periods including sweeping (initializing), storing and reading.

First, in the initializing period, charges remaining in the carrier pocket 25 and the first and second well regions 15a and 15b are discharged. Specifically, high positive voltages of about 7 to 8 V are applied to the drain and the gate of the MOS transistor 112 for optical signal detection, respectively through the VDD supply lines 22a and 22b and the VSCAN supply lines 21a and 21b.

At this time, since a thickness of the n type well layer 12 under the second well region 15b is thin, and the p type buried layer 33 having a high concentration is in contact with the substrate 11 side of the n type well layer 12, the voltage to the gate electrode 19 is applied only to the second well region 15b and its extremely close region. In other words, a sudden potential change occurs in the second well region 15b, and an electric field strong enough to sweep holes to the substrate 11 side is applied mainly to the second well region 15b. Accordingly, carriers can be swept away more accurately by a low resetting voltage, making it possible to increase resetting efficiency.

Subsequently, a low gate voltage is applied to the gate electrode 19 of the MOS transistor 112 for optical signal detection, and voltage (VDD) of about 2 to 3 V necessary for a transistor operation are applied to the drain regions 17a and 17b. At this time, the first well region 15a, the n type well layer 12 and the n type buried layer 32 are depleted, and the second well region 15b is depleted. Then, an electric field is generated to be directed from the drain regions 17a and 17b to the source regions 16a and 16b.

Subsequently, the photodetection diode 111 is irradiated with a light. In this case, since a carrier generation region of the photodetection diode 111 portion is formed near the surface, sensitivity is enhanced even to a light, e.g., a blue light, having a short wavelength and easily attenuated near the surface. Also, because of a thick total thickness thereof, sensitivity is enhanced even to a light, e.g., a red light, having a long wavelength reaching the deep portion of the photodetector. Therefore, an electron and hole pair (light generation charge) can be efficiently generated.

The foregoing electric field causes light generation holes among the optically generated charges to be injected into the gate region 15b of the MOS transistor 112 for optical signal detection, and stored in the carrier pocket 25. Accordingly, a limitation is placed on the width of the depletion layer spread from the channel region to the gate region 15b under it, a potential near the source regions 16a and 16b is modulated, and the threshold voltage of the MOS transistor 112 is changed.

In the initializing and storing periods, when positive voltages are applied to the n type drain regions 17a and 17b, since the interface between the element isolation insulating film 14 and the semiconductor layer is covered with the element isolation region 13, the interface is not exposed to the depletion layer spread from the well region, and accordingly the charges captured in the defects of the interface can be prevented from being discharged into the depletion layer. It is therefore possible to suppress fixed pattern noise generated by the storage of the charges in the hole pocket 25 caused by the defects.

In addition, when positive voltages are applied to the n type drain regions 17a and 17b, since the drain electrode 22 is connected near the element isolation insulating film 14, even if charges are discharged from the defects of the vicinity of the element isolation insulating film 14, the flowing of the charges toward the hole pocket 25 can be prevented. Thus, it is possible to further suppress fixed pattern noise generated by the storage of the charges in the hole pocket 25 caused by the defects.

Figure 7:
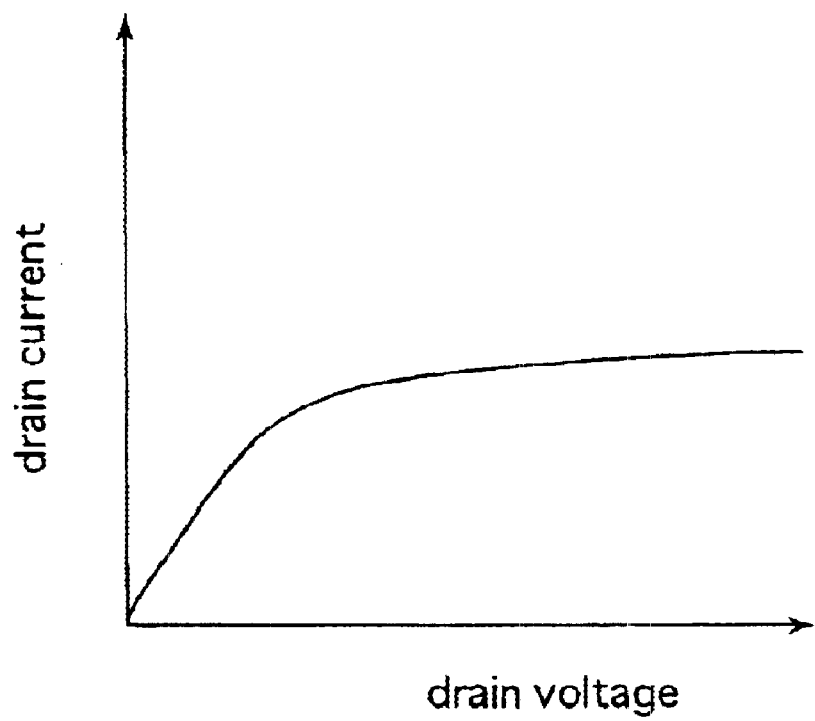
FIG. 7 is a graph showing a drain current-voltage characteristic of the MOS transistor for optical signal detection provided in the solid state imaging device of the first embodiment of the present invention.

Subsequently, a gate voltage of about 2 to 3 V is applied to the gate electrode 19 to enable the MOS transistor 112 to operate in a saturated state, and voltages VDD of about 2 to 3 V are applied to the drain regions 17a and 17b to enable the MOS transistor 112 to operate. Thus, an inversion region of a low electric field is formed in a part of the channel region on the carrier pocket 25, and a high electric field region is formed in a remaining portion. In this case, a drain voltage-current characteristic of the MOS transistor 112 shows a state of saturation as shown in FIG. 7.

Further, the constant current source 106 is connected to the source regions 16a and 16b of the MOS transistor 112, and a constant current is flown thereto. Accordingly, the MOS transistor 112 forms a source follower circuit. Thus, a source potential is changed following fluctuation in the threshold voltage of the MOS transistor 112 caused by light generation holes, and an output voltage is changed.

In this way, a video signal (Vout) proportional to the amount of light irradiation can be taken out.

As apparent from the foregoing, according to the embodiment of the present invention, in the initializing and storing periods, it is possible to furthermore suppress fixed pattern noise generated by the storage of charges in the hole pocket 25 caused by the defects created in the interface between the element isolation insulating film 14 and the element isolation region 13.

In a series of periods of sweeping (initializing)-storing-reading, it is possible to realize an ideal photoelectric conversion mechanism that does not interact with a noise source on the semiconductor surface or in the channel region when light generation holes are moved.

In addition, by the storage of charges in the carrier pocket 25, as shown in FIG. 7, the MOS transistor 112 can be operated in a saturated state and, because of the formation of the source follower circuit, a change of the threshold voltage caused by optically generated charges can be detected as a change of a source potential. Thus, photoelectric conversion with good linearity can be carried out.

Figure 10:
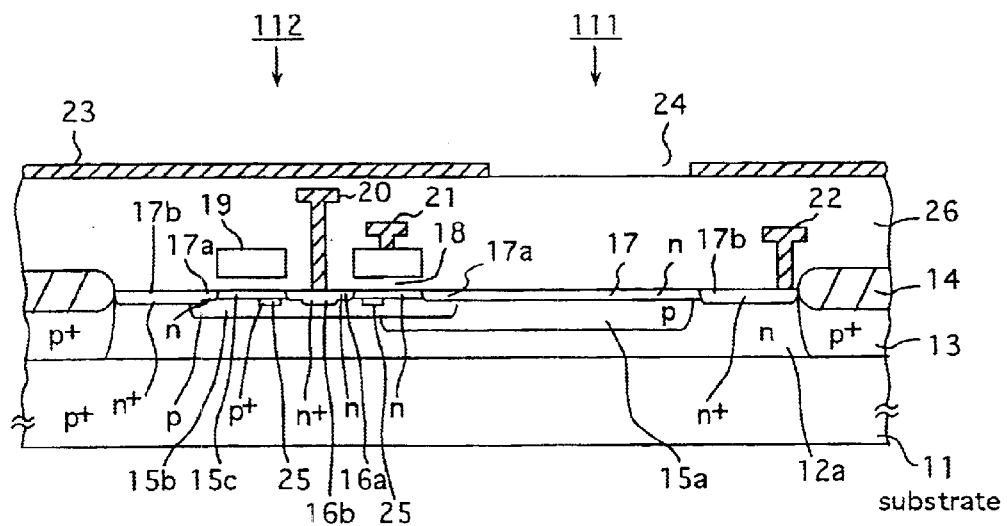
FIG. 10 is a sectional view showing a device structure in a unit pixel of a solid state imaging device according to an embodiment other than the first embodiment of the present invention.

Next, description will be made of a solid state imaging device according to an embodiment other than the first embodiment of the present invention. FIG. 10 is a plan view showing a solid state imaging device according to another embodiment of the present invention. In the drawing, portions like those in FIG. 3A are denoted by like reference numerals, and explanation thereof will be omitted.

The solid stage imaging device of the described embodiment is, as shown in FIG. 10, different in constitution from that shown in FIG. 3A in the following respects: the p type epitaxial layer 31 is not formed on the p type substrate (first semiconductor layer) 11, and an n type epitaxial layer (a region of one conductivity type, second semiconductor layer) 12a equivalent to the region 12 of one conductivity type of FIG. 3A is formed; the first and second well regions 15a and 15b are formed in the n type epitaxial layer 12a; and the n and p type buried layers 32 and 33 formed in the p type epitaxial layer 31 of FIG. 3A are not provided.

In this solid state imaging device, similarly to the device shown in FIG. 3A, the p type element isolation region 13 is formed on the p type substrate (first semiconductor layer) 11 below the element isolation insulating film 14 to include the lower surface of the element isolation insulating film 14 an to isolate the n type epitaxial layer (a region of one conductivity type, second semiconductor layer) 12a. In other words, even if defects occur in the interface between the element isolation insulating film 14 and the element isolation region 13, such defects are surrounded with the element isolation region 13.

Accordingly, as in the case of the device of FIG. 3A, charges captured in the defects in the interface between the element isolation insulating film 14 and the element isolation region 13 can be prevented from being discharged into a depletion layer thereof. It is therefore possible to suppress fixed pattern noise generated by the storage of charges in the hole pocket (carrier pocket) 25 caused by the defects in the interface.

In addition, similarly to the device of FIG. 3A, a drain electrode 22 is provided near the element isolation insulating film 14 and the element isolation region 13. Thus, as in the case of the device of FIG. 3A, even if defects occur in the vicinity of the element isolation insulating film 14 due to thermal distortion or the like, and charges captured in the defects are discharged, the charges are caused to immediately flow to the substrate side 11. It is accordingly possible to further suppress fixed pattern noise generated by the storage of charges in the hole pocket 25, which have been discharged from the defects in the vicinity of the element isolation insulating film 14.

The first embodiment of the present invention has been described. It should be understood, however, that the scope of the present invention is not limited to the specific examples of the first embodiment, and changes and modifications of the embodiment without departing from the teachings of the present invention are all within the scope of the present invention.

For example, in the first embodiment, the element isolation insulating film 14 is formed on the element isolation region 13 by local oxidation of silicon (LOCOS). However, the present invention can be applied to a case where a normal thermal oxide film or the like is formed. Accordingly, fixed pattern noise can be prevented as in the case of the first embodiment. Generally, an interface state tends to occur in the interface between the insulating film and the semiconductor layer. In the case that the element isolation insulating film 14 is adjacent to the drain regions 17a and 17b, in the end portions of the drain regions 17a and 17b, the pn junction tail end of the drain regions 17a and 17b is in contact with the surface, and an interface state is included in the depletion layer spread from the drain regions 17a and 17b in a transverse direction. It is because current leakage tends to occur in this way.

The drain electrode 22 is formed in the end portion of the drain region 17b and near the element isolation region 13. However, this drain electrode 22 may be provided far from the end portion of the drain region 17b and the element isolation region 13. Also, in this case, since the defects in the interface between the element isolation insulating film 14 and the element isolation region 13 are surrounded with the element isolation region 13, when positive voltages are applied to the n type drain regions 17a and 17b in the initializing and storing periods, a depletion layer spread from the p type well regions 15a and 15b or the p type substrate 11 reaches only the outer peripheral part of the element isolation region 13 without being spread therein. Accordingly, the defects in the interface are not covered with the depletion layer, making it possible to prevent charges captured in the defects from being discharged into the depletion layer. Thus, it is possible to suppress fixed pattern noise generated by the storage of charges in the hole pocket 25 caused by the defects.

Furthermore, an n type substrate may be used instead of the p type substrate 11. In this case in order to obtain an effect similar to that provided by the foregoing embodiment, all the conductivity types of the layers and the regions described above with reference to the embodiment may be reversed. When such a reversal is made, among electrons and holes, electrons should be selected as carriers to be stored in the carrier pocket 25.

(Second Embodiment)

Next, description will be made for a second embodiment of the present invention with reference to the accompanying drawings.

Figure 11:
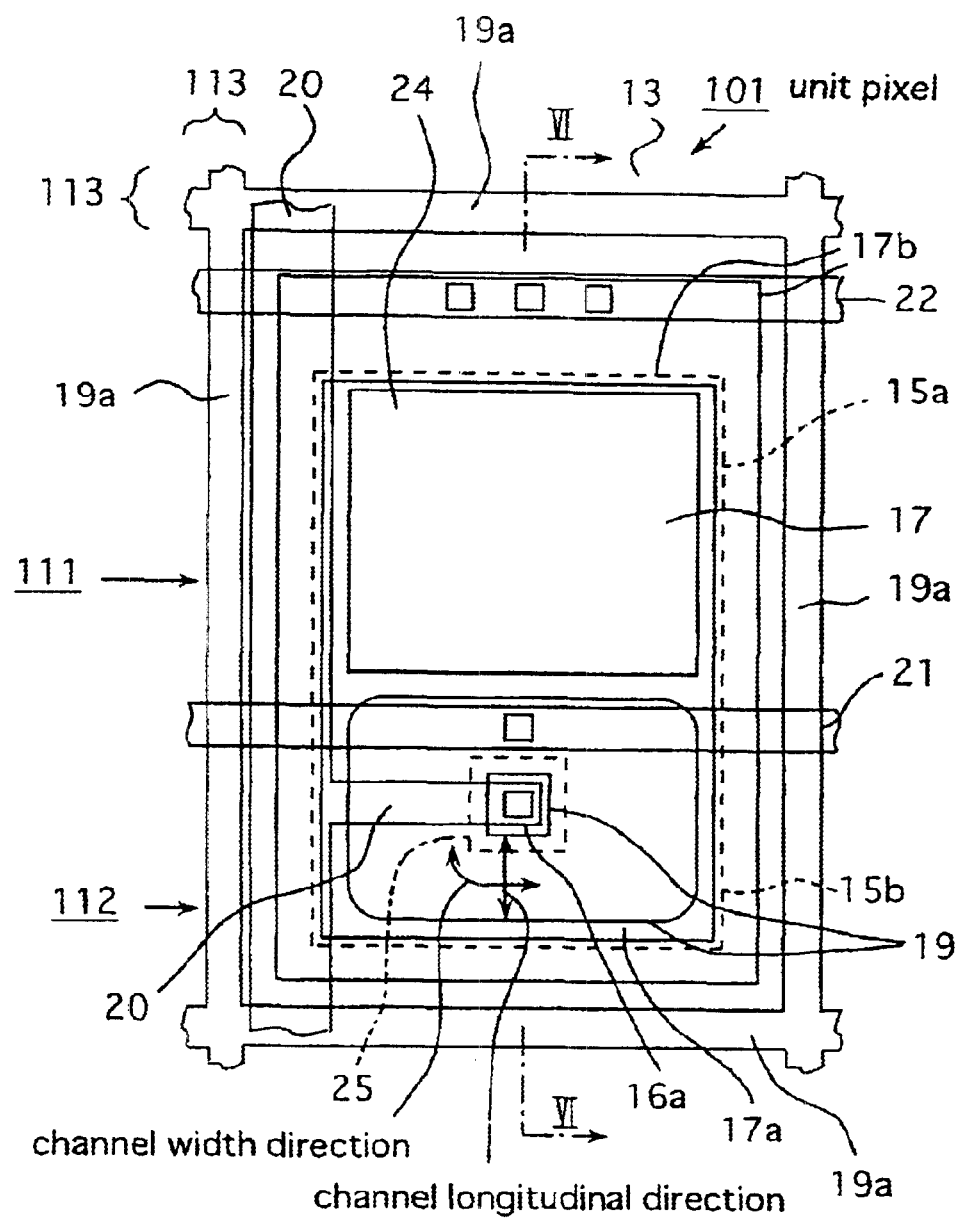
FIG. 11 is a plan view showing an element layout in a unit pixel of a solid state imaging device according to a second embodiment of the present invention.
Figure 12A:
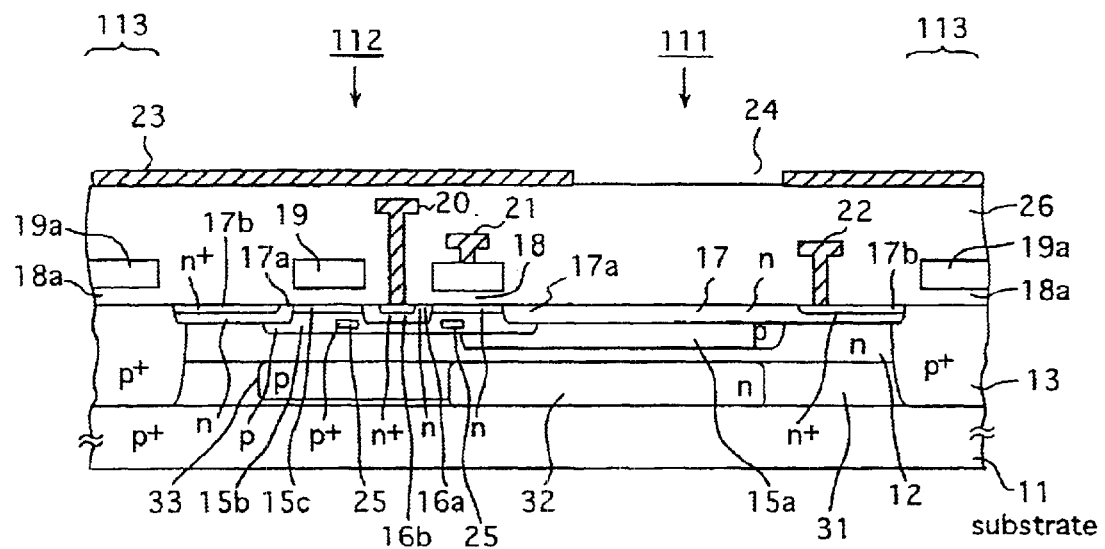
FIG. 12A is a sectional view taken on line VI—VI of FIG. 11, showing a device structure in the unit pixel of the solid state imaging device of the second embodiment of the present invention.

FIG. 11 is a plan view showing an element layout in a unit pixel of a MOS image sensor according to the second embodiment of the present invention. FIG. 12A is a sectional view taken along the line VI—VI of FIG. 11.

As shown in FIG. 11, adjacent unit pixels 101 are isolated from each other by an element isolation region 113. The element isolation region 113 includes an element isolation electrode 19a formed to surround each unit pixel 101. The element isolation electrode 19a is made of polysilicon, a material similar to that for the gate electrode 19, and formed at the same time when the gate electrode 19 is formed.

As shown in FIG. 12A, an impurity region 17 and a drain region 17a adjacent to each other between the unit pixels 101 are isolated from each other below the element isolation electrode 19a. Below the element isolation electrode 19a, a diffusion separation region 13 containing p type impurities is also formed to reach a p type silicon substrate (substrate) 11, thus adjacent n type well layers 12 between the unit pixels 101 are isolated from each other. In this case, the element isolation electrode 19a is set at a grounding potential by a wire (not shown).

In the unit pixel 101, a photodetection diode 111 and a MOS transistor 112 for optical signal detection are provided adjacently to each other. For the MOS transistor 112, an n channel MOS (nMOS) is employed.

The photodetection diode 111 and the MOS transistor 112 are respectively formed in first and second well regions 15a and 15b, which are connected to each other. The first well region 15a of the photodetection diode 111 portion constitutes a part of a charge generation region by light irradiation. The second well region 15b of the MOS transistor 112 portion constitutes a gate region capable of changing a channel threshold voltage by a potential applied to the region 15b.

On the p type silicon substrate 11, an n type buried layer 32 and an n type well layer 12 are formed sequentially from the lower side. The first well region 15a is formed in this n type well layer 12. On the p type substrate 11, a p type epitaxial layer 31, a p type buried layer 33 and an n type well layer 12 are formed sequentially from the lower side. The second well region 15b is formed in this n type well layer 12.

In the MOS transistor 112 portion, a ring-shaped gate electrode 19 is formed above the second well region 15b by interpolating a gate insulating film 18. The drain region 17a is formed in the second well region 15b to surround the outer edge part of the ring-shaped gate electrode 19. A source region 16a is formed in the second well region 15b to be surrounded with the inner edge part of the ring-shaped gate electrode 19. The well region 15b between the source region 16a and the drain region 17a below the gate electrode 19 becomes a channel region. In the channel region, an n type channel doped layer 15c is formed to enable the channel region to maintain a depletion or inversion state by a gate potential of zero.

Further, a carrier pocket (buried layer having a high concentration) 25 as a feature of the MOS image sensor is formed in the second well region 15b below the channel region and in the peripheral portion of the source region 16a to surround the same.

The drain region 17a is extended to form an impurity region 17 for the photodetection diode 111. Specifically, the impurity region 17 and the drain region 17a are formed to be united with each other such that most parts thereof can be placed in contact with the surface layers of the first and second well regions 15a and 15b connected to each other. In the outer peripheral portion of the impurity region 17 and the drain region 17a, a drain region having a high concentration 17b is formed as a contact layer so as to be connected to the drain region 17a by being kept away from a photodetector.

The drain region 17a is connected through the contact layer 17b of low resistance to a drain voltage (VDD) supply line (or a drain electrode) 22; the gate electrode 19 to a vertical scanning signal (VSCAN) supply line 21; and the source region 16a through the contact layer 16b of low resistance to a vertical output line (or a source electrode) 20.

The regions other than the light receiving window 24 of the photodetection diode 111 are shielded from lights by a metal layer (light shielding film) 23.

Figure 12B:
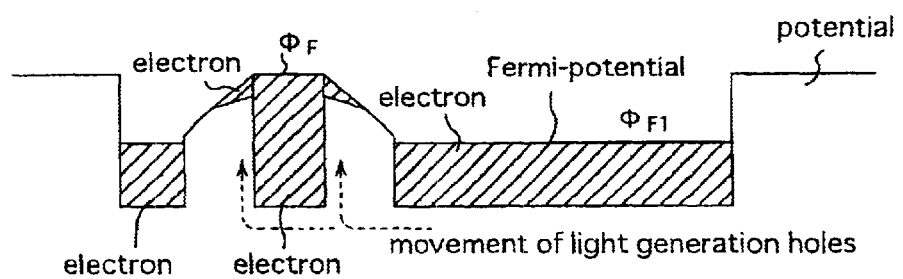
FIG. 12B is a view showing a state of a potential, where light generation holes are stored in a carrier pocket, and electrons are induced in a channel region to form an inversion region in a source side.

FIG. 12B shows a state of a potential where light generation holes are stored in the carrier pocket 25, and electrons are induced in the channel region to form an inversion region in the source side. The stored charges cause a change in the threshold voltage of the MOS transistor 112. Thus, optical signal detection can be carried out by detecting such a change in the threshold voltage.

Next, description will be made for a manufacturing method of the solid state imaging device by referring to FIGS. 13A to 13F. The description will focus on the method of forming the element isolation region related to the present invention.

Figure 13A:
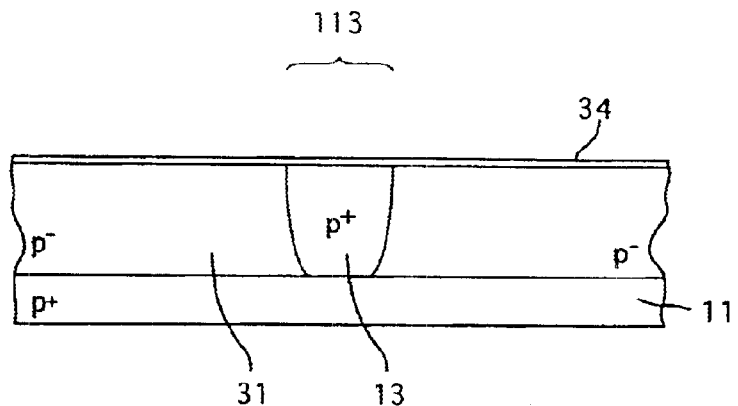
FIGS. 13A to 13F are sectional views, each thereof showing a manufacturing method of the solid state imaging device of the second embodiment of the present invention.

In the manufacturing method of the solid state imaging device, as shown in FIG. 13A, a semiconductor substrate is used, where a p type epitaxial layer 31 is formed on a p type silicon substrate (substrate) 11.

First, a silicon oxide film 34 is formed on the surface layer of the p type epitaxial layer 31 of the semiconductor substrate by thermal oxidation. Then, the regions other than an element isolation region 113 are covered with a resist film (not shown), and p type impurities are injected by ion implantation to reach at least the silicon substrate 11. Then, necessary heating or the like is carried out to form a p type diffusion separation region 13.

Figure 13B:
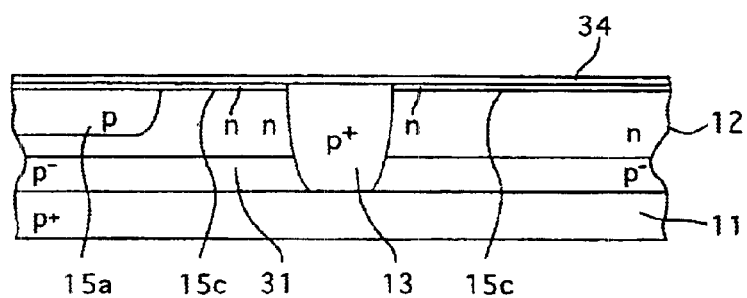

Subsequently, as shown in FIG. 13B, in the p type epitaxial layer 31, a first p type well region 15a, an n type well layer 12 and an n type channel doped layer 15c are formed in this order by ion implantation. In this case, since concentrations of the n type buried layer 32, the n type well layer 12 and the channel doped layer 15c are lower than the diffusion separation region 13, the n type buried layer 32, the n type well layer 12 and the channel doped layer 15c, which are placed in adjacent relation between the adjacent unit pixels are isolated in self alignment by the diffusion separation region 13.

Figure 13C:
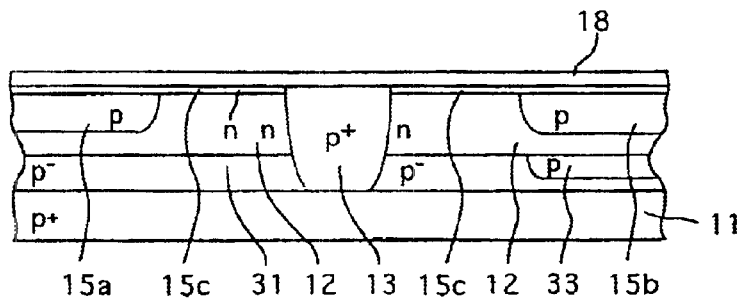

Then, as shown in FIG. 13C, after the formation of a second well region 15b in the n type well layer 12, the substrate surface is oxidized from above the silicon oxide film 34 to form a silicon oxide film 18 having a thick film thickness. Subsequently, a p type buried layer 33, and a second p type well region 15b are formed in this order by ion implantation.

Figure 13D:
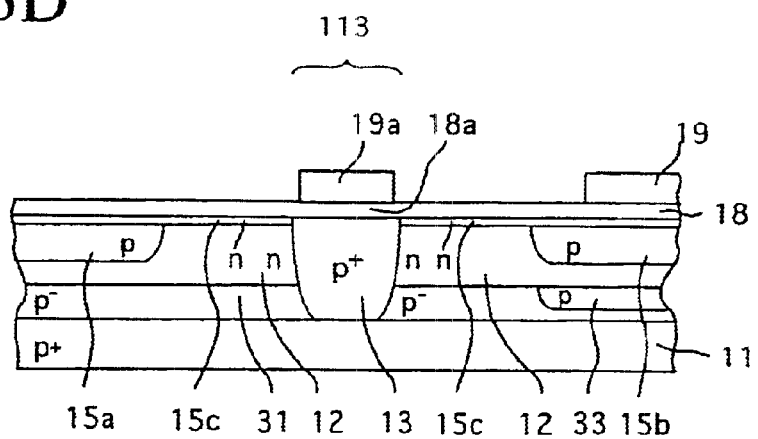

Then, as shown in FIG. 13D, after the formation of a polysilicon film (conductive film) on the surface of the silicon oxide film 18, the polysilicon film is subjected to patterning to form a ring-shaped gate electrode 19 above the second well region 15b, and an element isolation electrode 19a above the diffusion separation region 13 of the element isolation region 113. The silicon oxide film under the gate electrode 19 becomes a gate insulating film 18, and the silicon oxide film under the element isolation electrode 19a becomes an insulating film 18a.

Figure 13E:
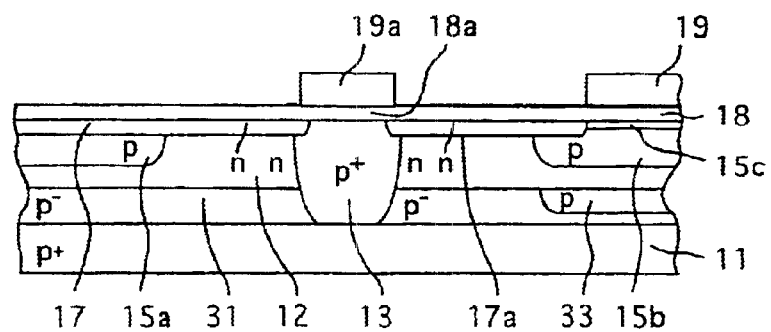

Subsequently, as shown in FIG. 13E, by using the gate electrode 19 and the element isolation electrode 19a as masks, n type impurities are ion-implanted through the silicon oxide film 18 to form an impurity region 17 and an n type drain region 17a. In this case, a dosage of the n type impurities which is converted in volume concentration is substantially equal to or higher than the concentration of the diffusion separation region 13. However, because of the masking by the element isolation electrode 19a, the drain regions 17a adjacent to each other between the adjacent unit pixels are isolated from each other below the element isolation electrode 19a.

In this process, an n type source region 16a is formed in the second well region 15b inside the ring-shaped gate electrode 19, as shown in FIG. 12A.

Figure 13F:
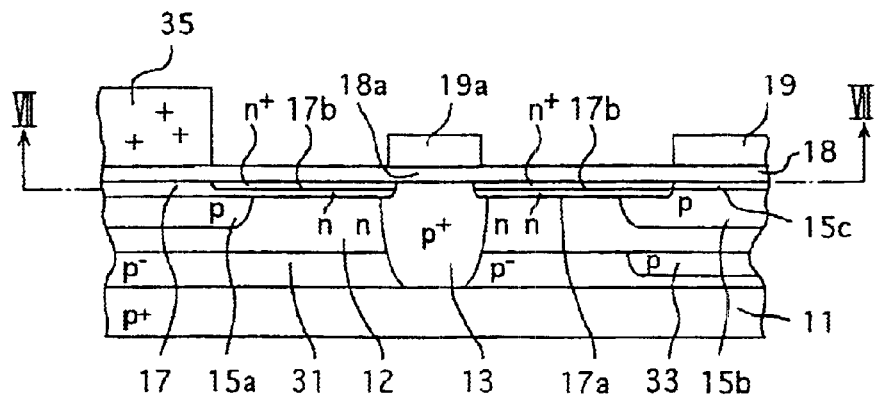

Subsequently, as shown in FIG. 13F, after the formation of a resist film 35 covering the photodetector of the photo-detection diode 111, by using the resist film 35, the gate electrode 19 and the element isolation electrode 19a as masks, n type impurities are ion-implanted through the silicon oxide film 18, and an n type contact layer 17b concentrated more highly than the drain region 17a is formed in the drain region 17a and the impurity region 17. In this case, a dosage of n type impurities which is converted in volume concentration is higher than the concentration of the diffusion separation region 13. However, because of the masking by the element isolation electrode 19a, the drain regions 17b adjacent to each other between the adjacent unit pixels are isolated from each other below the element isolation electrode 19a.

In this process, an n type contact layer 16b is formed in the source region 16a, as shown in FIG. 12A.

Then, after a specified process, a solid state imaging device shown in FIG. 12A is manufactured. The element isolation electrode 19a is left as it is, and set at a grounding potential.

According to the solid state device manufactured in the foregoing process, during the formation of the drain regions 17a and 17b by using the gate electrode 19 as a mask, n type impurities are ion-implanted with the element isolation electrode 19a formed in the element isolation region 113 as a mask, and then the adjacent drain regions 17a and 17b or the like between the unit pixels 101 are isolated.

Accordingly, the occurrence of defects caused by thermal distortion or the like is reduced in the interface between the insulating film 18 of the element isolation region 113 and the drain regions 17a and 17b. Thus, since the discharging of holes caused by the defects in the boundary between the element isolation region 113 and the drain regions 17a and 17b or the like is greatly reduced, it is possible to further suppress fixed pattern noise generated by the storage of holes other than light generation holes in the hole pocket 25.

In addition, the element isolation region 113 includes the diffusion separation region 13 formed to reach the silicon substrate 11. In this case, by setting the diffusion separation region 13 at a grounding potential or a negative potential with the silicon substrate 11 set at a grounding potential or a negative potential, even if any defect occurs in the boundary between the drain regions 17a and 17b or the impurity region 17 near the element isolation region 113 and the insulating film 18a, holes from the defects can be discharged through the diffusion separation region 13 to the silicon substrate 11. Thus, it is possible to further suppress fixed pattern noise generated by the storage of holes other than light generation holes in the hole pocket 25.

Figure 14:
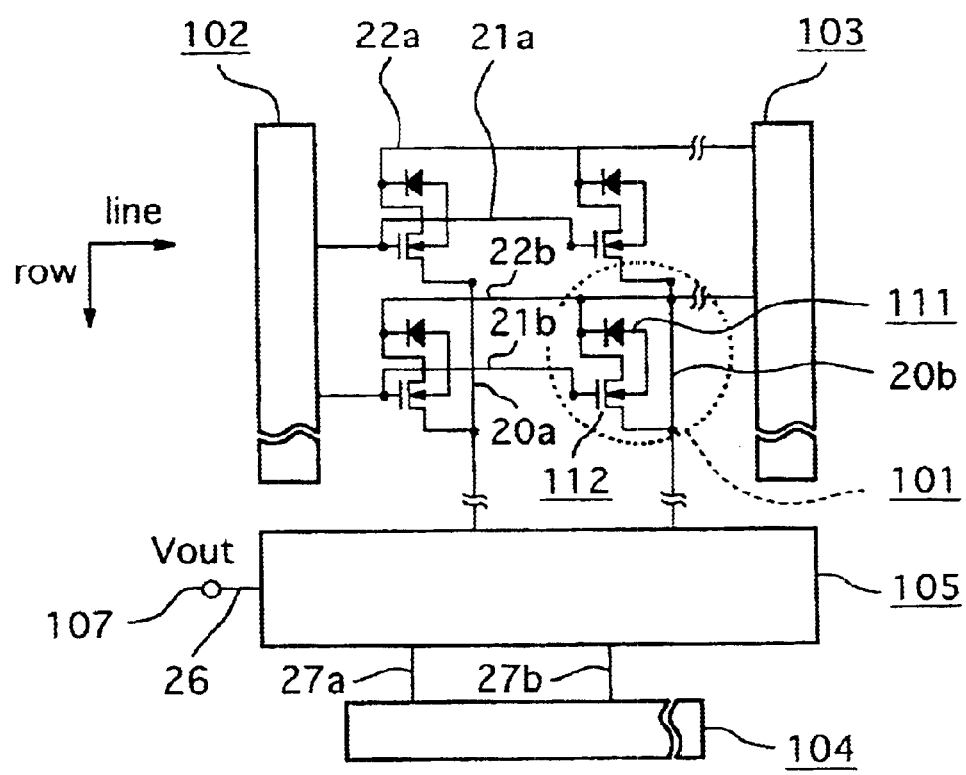
FIG. 14 is a view showing an entire circuitry of the solid state imaging device of the second embodiment of the present invention.

Next, description will be made of an entire constitution of the MOS image sensor having the unit pixel 101 of the structure shown in FIG. 11 by referring to FIG. 14. FIG. 14 shows a circuitry of the MOS image sensor of the described embodiment of the present invention.

As shown in FIG. 14, this MOS image sensor employs a constitution of a two dimensional array sensor, and the unit pixels 101 of the foregoing structure are arrayed in row and column directions in a matrix shape. In the embodiment, the 2-row and 2-column arrangement of unit pixels is described for the purpose of explanation.

A driving scanning circuitry 102 for a vertical scanning signal (VSCAN) and a driving scanning circuitry for a drain voltage (VDD) are disposed.

Vertical scanning signal supply lines 21a and 21b are drawn out, one for each row, from a driving scanning circuit 102 for a vertical scanning signal (VSCAN). The vertical scanning signal supply lines 21a and 21b are connected to the gate electrodes 19 of the MOS transistors in all the unit pixels 101 arrayed in the row direction.

Drain voltage supply lines (VDD supply lines) 22a and 22b are drawn out, one for each row, from a driving scanning circuit 103 for a drain voltage (VDD). The drain voltage supply lines (VDD supply lines) 22a and 22b are connected to the drain regions 17a of the MOS transistors 112 for optical signal detection in all the unit pixels 101 arrayed in the row direction.

In addition, vertical output lines 20a and 20b, different for each column, are provided. The vertical output lines 20a and 20b are connected to the source regions 16a of the MOS transistors 112 in all the unit pixels 101 arrayed in the column direction.

Further, the source region 16a of the MOS transistor 112 is connected through the vertical output lines 20a and 20b to a signal output circuit 105. The signal output circuit 105 stores a potential of the source region 16a in the memory, and then outputs a video signal corresponding to the potential of the source region 16a through a horizontal output line 26 to a video signal output terminal 107. The signal is stored in the memory by an HSCAN input scanning circuit 104, and timing for an output from the signal output circuit 105 is controlled.

Next, description will be made of a device operation for optical signal detection in the MOS image sensor of the second embodiment.

In the device operation for optical signal detection, a series of period including sweeping (initializing), storing and reading are repeated, for example in the order of sweeping (initializing)-storing-reading-sweeping (initializing)- . . . .

First, by the initializing operation, charges remaining in the carrier pocket 25 and the first and second well regions 15a and 15b are discharged. Specifically, high positive voltages of, e.g., 7 to 8 V, are respectively applied to the drain of the MOS transistor 112 for optical signal detection through the VDD supply lines 22a and 22b and the gate thereof through the VSCAN supply lines 21a and 21b.

Then, a low gate voltage is applied to the gate electrode 19 of the MOS transistor 112 for optical signal detection, and voltages (VDD) of about 2 to 3 V are applied to the drain regions 17a and 17b. At this time, the first well region 15a, the n type well layer 12 and the n type buried layer 32 are depleted, and the second well region 15b is also depleted. Then, an electric field is generated, which is directed from the drain regions 17a and 17b to the source regions 16a and 16b.

Subsequently, The photodetection diode 111 is irradiated with a light to generate an electron-hole pair (light generation charge). By the above electric field, among these optically generated charges, light generation holes are transferred to the gate region 15b of the MOS transistor 112 for optical signal detection, and stored in the carrier pocket 25. Accordingly, a limitation is placed on the width of a depletion layer spread from the channel region to the gate region 15b under it, and a potential in the vicinity of the source regions 16a and 16b is modulated, causing a change in the threshold voltage in the MOS transistor 112.

Figure 15:
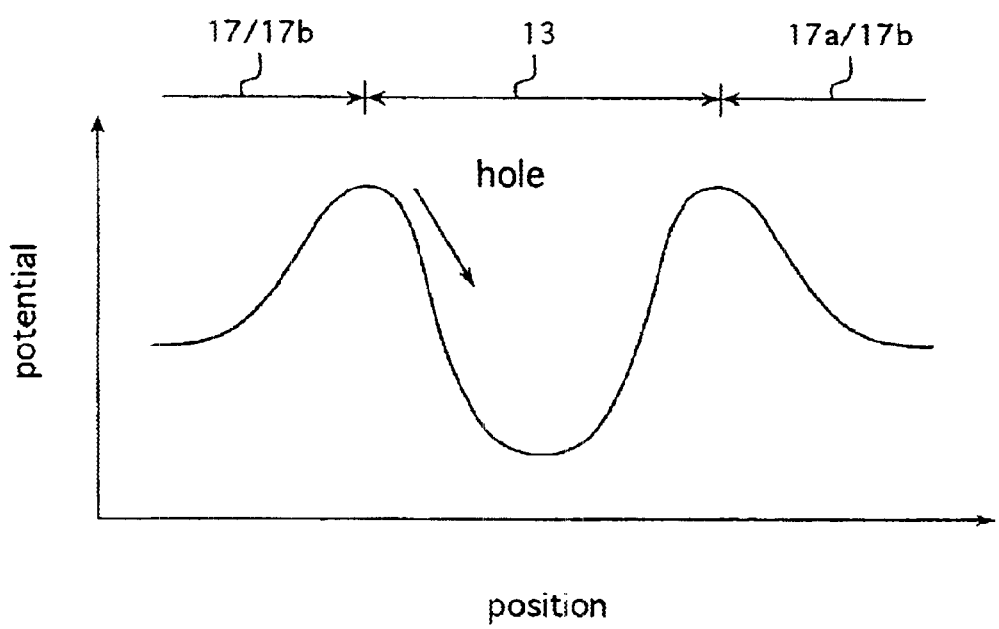
FIG. 15 is a view taken on line VII—VII of FIG. 13F, showing a state of a potential in the vicinity of an element isolation region of the solid state imaging device.

In the foregoing initializing and storing periods, by setting the diffusion separation region 13 at a grounding potential through the silicon substrate 11, a potential is formed for the hole like that shown in FIG. 15. Thus, even if holes are discharged from the defects near the insulating film 18a, the holes can be prevented from being discharged through the diffusion separation region 13 to the silicon substrate 11 and flowing to the hole pocket 25. It is therefore possible to further suppress fixed pattern noise generated by the storage of charges in the hole pocket 25 caused by the defects.

Subsequently, the MOS transistor 112 applies a gate voltage of about 2 to 3 V to the gate electrode 19, and voltages VDD of about 2 to 3 V to the drain regions 17a and 17b. In this manner, an inversion region of a low electric field is formed in a portion of the channel region above the carrier pocket 25, a high electric field region is formed in the rest of the portion, and the MOS transistor 112 is operated in a saturated state.

At this time, a source potential is changed corresponding to fluctuation in the threshold voltage of the MOS transistor caused by the light generation holes, and the change of the source potential is stored in the memory of the signal output circuit 105. Then, by a proper timing, a video signal (Vout) proportional to the quantity of light irradiation can be taken out from the signal output circuit 105.

Apparently from the foregoing, according to the solid state imaging device of the embodiment, since microfabrication can be realized and fixed pattern noise can be suppressed, by assembling this solid state imaging device in a solid state imaging apparatus, e.g., a video camera, an electronic camera, an image input camera, a scanner, a facsimile or the like, it is possible to miniaturize the apparatus and improve image quality.

The second embodiment of the present invention has been described in detail. However, the scope of the present invention is not limited to the specific examples in the second embodiment, and changes and modifications of the embodiment without departing from the teachings of the present invention are within the scope of the present invention.

For example, in the second embodiment, the diffusion separation region 13 is formed in the element isolation region 113. However, without forming the diffusion separation region 13, an n type well layer 12 may be selectively formed in the area other than the element isolation region 13, and a p type epitaxial layer 31 connected to the p type substrate 11 may be left up to the surface.

Instead of forming the ring-shaped gate electrode 19, a rectangular gate electrode may be provided. In this case, the element isolation region 113 isolates the adjacent source regions in the unit pixel from each other, alternatively the source region from the drain region or the impurity region, otherwise the drain regions or the impurity regions from each other.

In the embodiment, the element isolation region 113 is formed to surround each unit pixel 101. However, the element isolation region 113 may be formed only between columns (longitudinal direction) or between rows (transverse direction) as shown in FIG. 15.

Figure 16:
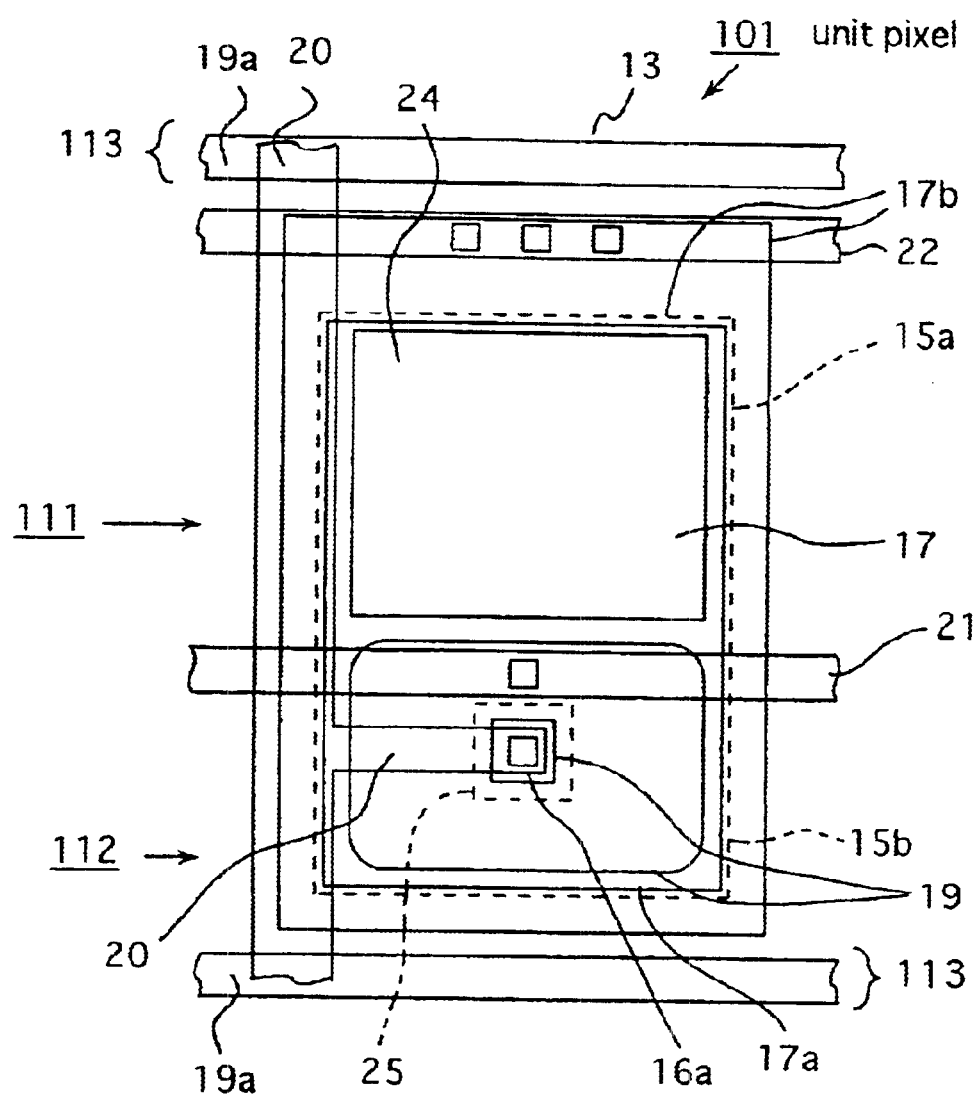
FIG. 16 is a plan view showing an element layout in a unit pixel of a solid state imaging device according to an embodiment other than the second embodiment of the present invention.

For example, for separation only between rows (transverse direction), as shown in FIG. 16, the element isolation region 113 is formed only between the rows for separation. In this case, the unit pixels 101 arrayed in a row are not isolated from each other, and the drain regions 17a and 17b are connected to each other.

Furthermore, instead of the p type silicon substrate 11, an n type silicon substrate may be used. In this case, in order to obtain an effect similar to that provided by the embodiment, all the conductivity types of the layers and the regions described above with reference to the embodiment need only to be reversed. In such a case, among electrons and holes, electrons should be selected as carriers to be stored in the carrier pocket 25.

What is claimed is:

1. A manufacturing method of a solid state imaging device including a substrate of one conductivity type, a layer of an opposite conductivity type on said substrate, a well region of one conductivity type formed in said layer of an opposite conductivity type and a plurality of unit pixels, each thereof including, in said well region, a photodetection diode and an insulated gate field effect transistor placed adjacent to said photodetection diode for optical signal detection, comprising the steps of:

forming a gate insulating film above said well region and forming an insulating film made of a same material as that for said gate insulating film in an element isolation region for isolating adjacent unit pixels from each other;

patterning a conductive film to form a gate electrode on said gate insulating film and to form an element isolation electrode on said insulating film of said element isolation region; and introducing impurities of an opposite conductivity type by using said gate electrode and said element isolation electrode as masks to form source and drain regions and to isolate devices.

2. The manufacturing method of a solid state imaging device according to claim 1, further comprising a step of forming a carrier pocket near and along said source region in said well region below said gate electrode to store optically generated charges generated in said photodetection diode.

3. The manufacturing method of a solid state imaging device according to claim 2, wherein said gate electrode has a ring shape, said source region is formed in said well region inside said gate electrode, said drain region is formed in said well region outside said gate electrode, and said carrier pocket is formed near said source region in said well region below said gate electrode to surround said source region.

4. The manufacturing method of a solid state imaging device according to claim 1, further comprising a step of forming a diffusion separation region of one conductivity type in said element isolation region to reach said substrate, before said step of forming said gate insulating film and said insulating film made of said same material as that for said gate insulating film in said element isolation region for isolating said adjacent unit pixels from each other.

5. The manufacturing method of a solid state imaging device according to claim 1, wherein a material for said conductive film is polysilicon.

6. The manufacturing method of a solid state imaging device according to claim 1, wherein said solid state imaging device consists of a plurality of unit pixels arrayed in row and column directions, and said element isolation region is formed only between said columns or between said rows.

7. A solid state imaging device manufactured by said method specified in claim 1.

8. A solid state imaging apparatus comprising a solid state imaging device specified in claim 7.

* * * * *

UNITED STATES PATENT AND TRADEMARK OFFICE
CERTIFICATE OF CORRECTION

PATENT NO. : 6,653,164 B2
DATED : November 25, 2003
INVENTOR(S) : Takashi Miida

It is certified that error appears in the above-identified patent and that said Letters Patent is hereby corrected as shown below:

<u>Title page,</u>
Item [57], ABSTRACT,
Line 1, "sole" should read -- solid --;

<u>Column 12,</u>
Line 17, "NMOS" should read -- nMOS --.

Signed and Sealed this

Twenty-seventh Day of July, 2004

JON W. DUDAS
*Acting Director of the United States Patent and Trademark Office*